(12) United States Patent
Trainer et al.

(10) Patent No.: US 12,046,894 B2
(45) Date of Patent: Jul. 23, 2024

(54) CURRENT LIMITING DIODE

(71) Applicant: ROLLS-ROYCE plc, London (GB)

(72) Inventors: David R Trainer, Derby (GB); Mark Sweet, Chesterfield (GB)

(73) Assignee: ROLLS-ROYCE plc, London (GB)

(*) Notice: Subject to any disclaimer, the term of this patent is extended or adjusted under 35 U.S.C. 154(b) by 181 days.

(21) Appl. No.: 17/956,924

(22) Filed: Sep. 30, 2022

(65) Prior Publication Data

US 2023/0140274 A1    May 4, 2023

(30) Foreign Application Priority Data

Oct. 28, 2021 (GB) .................................... 2115517

(51) Int. Cl.
*H02H 9/02* (2006.01)
*H10N 10/17* (2023.01)
*H10N 10/82* (2023.01)

(52) U.S. Cl.
CPC ............ *H02H 9/025* (2013.01); *H10N 10/17* (2023.02); *H10N 10/82* (2023.02)

(58) Field of Classification Search
CPC ... H01L 29/861; H01L 29/0657; H10N 10/82; H10N 10/17; H02H 9/025
USPC ........................................................ 361/93.9
See application file for complete search history.

(56) References Cited

U.S. PATENT DOCUMENTS

| 5,581,100 | A | * | 12/1996 | Ajit | ...................... | H01L 29/0847 |
| | | | | | | 257/E29.255 |
| 2002/0118502 | A1 | | 8/2002 | Yabe et al. | | |
| 2015/0043114 | A1 | * | 2/2015 | Sarkar | ................. | H01L 27/0288 |
| | | | | | | 257/360 |
| 2017/0179946 | A1 | | 6/2017 | Turvey | | |

FOREIGN PATENT DOCUMENTS

| JP | 2002-261594 A | | 9/2002 | | |
| WO | 2009/060168 A1 | | 5/2009 | | |
| WO | WO-2009060168 A1 | * | 5/2009 | ......... | H01L 29/0657 |

OTHER PUBLICATIONS

Mar. 30, 2022 Search Report issued in Great Britian Application No. GB2115517.1.
Mar. 22, 2023 Search Report issued in European Patent Application No. 22198317.4.

* cited by examiner

*Primary Examiner* — Kevin J Comber
(74) *Attorney, Agent, or Firm* — Oliff PLC

(57) ABSTRACT

There is provided a current limiting diode 200 comprising a gate 206, a source 202, a drain 204 electrically connected to the source by an n-channel or p-channel 220 and a thermoelectric generator 208; wherein the source and the gate are electrically connected by a fill structure 210, and wherein the thermoelectric generator is configured to: generate a thermoelectric voltage by absorbing heat from the n-channel or p-channel and rejecting heat to a heat sink in a current limiting condition; and apply the thermoelectric voltage between the gate and the source.

13 Claims, 10 Drawing Sheets

100

CURRENT LIMITING DIODE

CROSS-REFERENCE TO RELATED APPLICATIONS

This specification is based upon and claims the benefit of priority from United Kingdom Patent Application No. 2115517.1, filed on 28 Oct. 2021, the entire contents of which are incorporated herein by reference.

FIELD OF THE DISCLOSURE

The present disclosure relates to a current limiting diode.

BACKGROUND

Current limiting diodes using both silicon and silicon carbide junction field-effect transistors (JFETs) are widely known. They are configured as 2-terminal devices which "saturate" at a near constant current level and are sometimes referred to as constant-current diodes. As such, they essentially function as highly non-linear resistors which increase in resistance very rapidly in response to a very large increase in an electrical current. The increase in electrical resistance moderates a magnitude of the electrical current while dissipating energy in the form of heat, which increases an internal temperature of the current limiting diode.

If a current limiting diode is operated above a threshold temperature for a significant period of time, damage to or loss of function of the current limiting diode may follow as a result. It is therefore advantageous to provide means for reducing an electrical current being passed through a current limiting diode so as to reduce the amount of heat dissipated within the current limiting diode and to therefore reduce a risk of the internal temperature of the current limiting diode rising above the threshold temperature.

SUMMARY

According to a first aspect there is provided a current limiting diode comprising a gate, a source, a drain electrically connected to the source by an n-channel or p-channel and a thermoelectric generator; wherein the source and the gate are electrically connected by a fill structure, and wherein the thermoelectric generator is configured to: generate a thermoelectric voltage by absorbing heat from the n-channel or p-channel and rejecting heat to a heat sink in a current limiting condition; and apply the thermoelectric voltage between the gate and the source.

It may be that the thermoelectric generator is disposed within the fill structure. In addition, it may be that the thermoelectric generator abuts the n-channel or p-channel for heat exchange therebetween.

It may also be that the thermoelectric generator comprises a p-type semiconductor and an n-type semiconductor.

Further, it may be that the thermoelectric generator comprises: a first metal which abuts the gate; and a second metal which abuts the source; and wherein the first metal has a Seebeck coefficient which differs from a Seebeck coefficient of the second metal.

The first metal may abut the n-channel or p-channel and the heat sink. The second metal may abut the n-channel or p-channel and the heat sink.

It may be that the drain is electrically connected to the source by an n-channel.

According to a second aspect there is provided a bidirectional current limiting device comprising a first current limiting diode and a second current limiting diode, wherein: each current limiting diode is in accordance with the first aspect; and the source of the first current limiting diode is electrically connected to the source of the second current limiting diode.

According to a third aspect there is provided an electrical power system comprising: a current limiting diode in accordance with the first aspect or a bidirectional current limiting device in accordance with the second aspect; an electrical power source; and an electrical network, and wherein the current limiting diode or the bidirectional current limiting device is configured to limit a fault current passing between the electrical power source and the electrical load network in a fault condition.

The electrical power system may further comprise a controllable circuit interruption device configured to interrupt the fault current in response to a determination that the electrical power system is in the fault condition. The electrical energy source may comprise a battery (e.g. a high-density battery). The electrical power system may further comprise a power electronics converter.

According to a fourth aspect, there is provided an aircraft power and propulsion system comprising the current limiting diode in accordance with the first aspect, the bidirectional current limiting device in accordance with the second aspect or the electrical power system of the third aspect.

According to a fifth aspect, there is provided an aircraft comprising the current limiting diode in accordance with the first aspect, the bidirectional current limiting device in accordance with the second aspect, the electrical power system of the third aspect or the aircraft power and propulsion system in accordance with the fourth aspect.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

Embodiments will now be described by way of example only, with reference to the Figures, in which.

DETAILED DESCRIPTION

Aspects and embodiments of the present disclosure will now be discussed with reference to the accompanying figures. Further aspects and embodiments will be apparent to those skilled in the art.

Figure 1A:
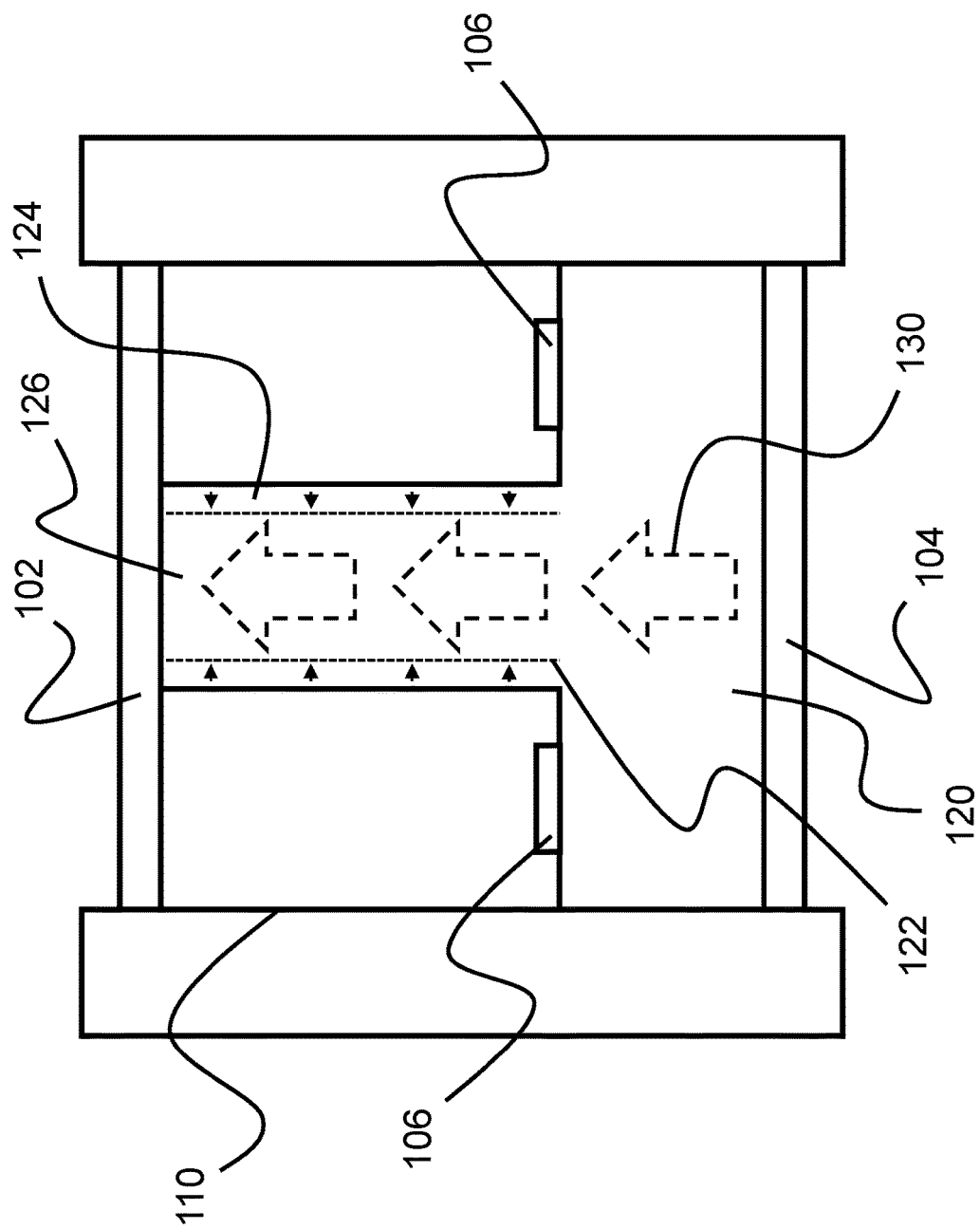
FIG. 1A is a cross-sectional view of a conventional current limiting diode in a normal operating condition.

FIG. 1A shows a cross-sectional view of a conventional current limiting diode 100 in a normal operating condition. The current limiting diode 100 comprises a junction field-effect transistor (JFET) provided with a source 102, a drain 104 and a gate 106, with the gate 106 being electrically connected to the source 102 by a fill structure 110 and the drain 104 being electrically connected to the source by an n-channel 120. Accordingly, the current limiting diode 100 is configured as a 2-terminal device which permits an electric current to be conducted through the n-channel 120 between the source 102 and the drain 104. In FIG. 1A, an electric current being conducted through the n-channel 120 between the source 102 and the drain 104 in the normal operating condition is represented by arrows 130.

The current limiting diode 100 has an electrical resistance which is primarily defined by a size of a depletion region 124 of the n-channel 120. The depletion region 124 is a region of the n-channel 120 in which there are no free charge carriers. As a result, an electric current cannot be conducted through the depletion region 124. However, an electric current may be conducted through a current-carrying path 126 through the n-channel 120. In FIG. 1A, a boundary between the depletion region 124 and the current-carrying path 126 is represented by the dashed lines 122. The size of the depletion region 124 corresponds to a magnitude of an electric current being passed through the n-channel from the drain 104 to the source 102. That is to say that if the magnitude of the electric current passing through the n-channel from the drain 104 to the source 102 is large, the size of the depletion region 124 will also be large, the size of the current-carrying path 126 will be small and the electrical resistance of the current limiting diode 100 becomes very large. However, the size of the depletion region 124 (and equally the size of the current-carrying path 126) does not correspond to a magnitude of an electric current being passed from the source 102 to the drain 104.

Figure 1B:
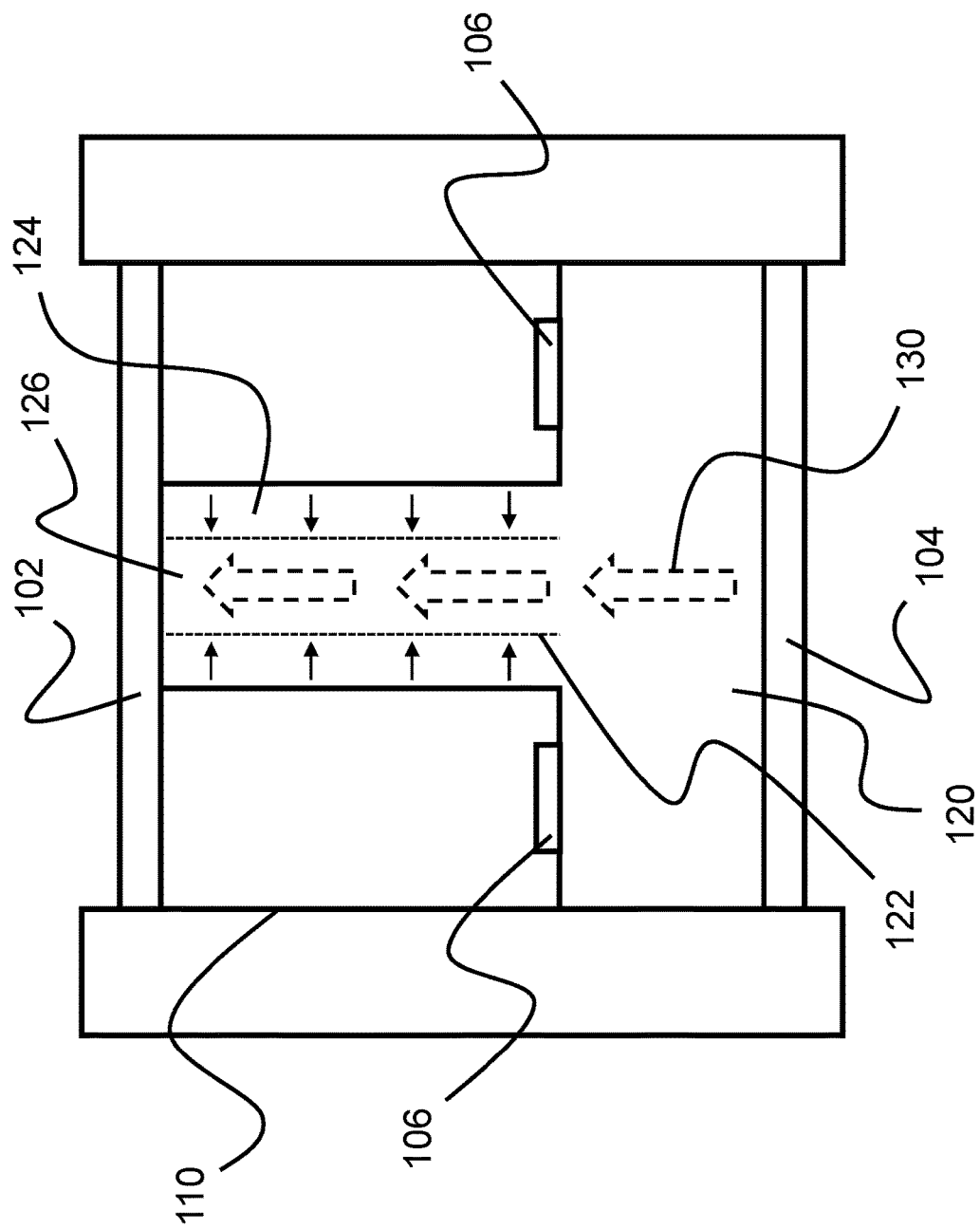
FIG. 1B is a cross-sectional view of the conventional current limiting diode shown in FIG. 1A in a current limiting condition.

FIG. 1B shows a cross-sectional view of the conventional current limiting diode 100 shown in FIG. 1A in a current limiting condition. In FIG. 1B, an electric current being conducted through the n-channel 120 between the source 102 and the drain 104 in the current limiting condition is represented by a plurality of thin dashed arrows 130. The electric current being conducted through the n-channel 120 in the current limiting condition may be a fault current which originates from an electrical power system in which the current limiting diode 100 is incorporated.

A relationship between the electrical resistance of the current limiting diode 100 and the magnitude of the electric current passing from the drain 104 to the source 102 is highly non-linear. In other words, the current limiting diode 100 operates in a manner which is analogous to a highly non-linear unidirectional resistor in that the electrical resistance of the current limiting diode 100 increases very rapidly as the magnitude of the electric current passing from the drain 104 to the source 102 increases above a saturation threshold. Accordingly, the current limiting diode 100 "saturates" at a near constant current level.

In the normal operating condition shown in FIG. 1A, a magnitude of an electric current being conducted through the current limiting diode 100 from the drain 104 to the source 102 is relatively low. Accordingly, the size of the depletion region 124 within the n-channel 120 is relatively small, the size of the current-carrying path 126 is relatively large and the electrical resistance of the current limiting diode 100 is also relatively small. Therefore, an amount of resistive heat dissipated by the current limiting diode 100 in the normal operating condition is low.

In the current limiting condition shown in FIG. 1B, the magnitude of the electric current being conducted through the current limiting diode 100 from the drain 104 to the source 102 is relatively high. Accordingly, the size of the depletion region 124 within the n-channel 120 is relatively large, the size of the current-carrying path 126 is relatively small and the electrical resistance of the current limiting diode 100 is also relatively large. Therefore, an amount of resistive heat dissipated by the current limiting diode 100 in the current limiting condition is high. Because only the current-carrying path 126 permits an electrical current to be conducted through it, the resistive heat is primarily generated within the current-carrying path 126. In both the normal operating condition and the current limiting condition, the resistive heat generated within the current-carrying path 126 causes an internal temperature profile to develop within the current limiting diode 100.

The current limiting diode 100 is cooled by means of conduction and/or convection to an environment. Consequently, in order to effectively dissipate the resistive heat in the current limiting condition, a maximum internal temperature of the current limiting diode 100 must rise substantially in the current limiting condition. The maximum internal temperature of the current limiting diode 100 corresponds to a maximum of the internal temperature profile. In practice, a resistive heat dissipation rate of the n-channel 120 in the current limiting condition may be sufficiently high such that the maximum internal temperature of the current limiting diode 100 rises above a threshold temperature at which damage to and loss of function of the current limiting diode 100 may occur.

Figure 2A:
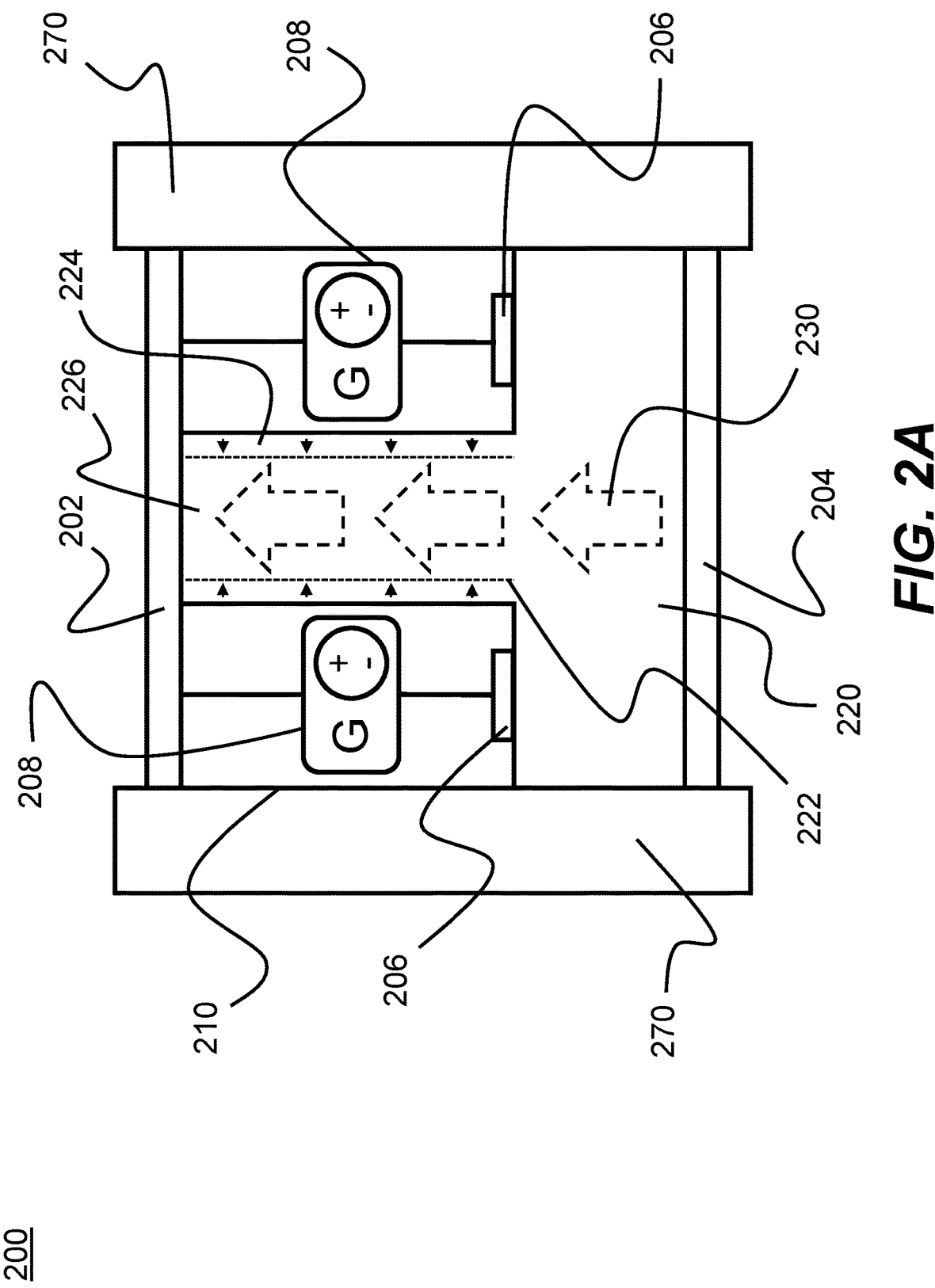
FIG. 2A is a cross-sectional view of a first example current limiting diode in a normal operating condition.

FIG. 2A shows a cross-sectional view of a first example current limiting diode 200 in a normal operating condition. The current limiting diode 200 comprises a junction field-effect transistor (JFET) provided with a source 202, a drain 204 and a gate 206, with the gate 206 being electrically connected to the source 202 by a fill structure 210 and the drain 204 being electrically connected to the source by an n-channel 220. Accordingly, the current limiting diode 200 is configured as a 2-terminal device which permits an electric current to be conducted through the n-channel 220 between the source 202 and the drain 204. In FIG. 2A, an electric current being conducted through the n-channel 220 between the source 202 and the drain 204 in the normal operating condition is represented by arrows 230. The current limiting diode 200 further comprises a thermoelectric generator 208.

Figure 2B:
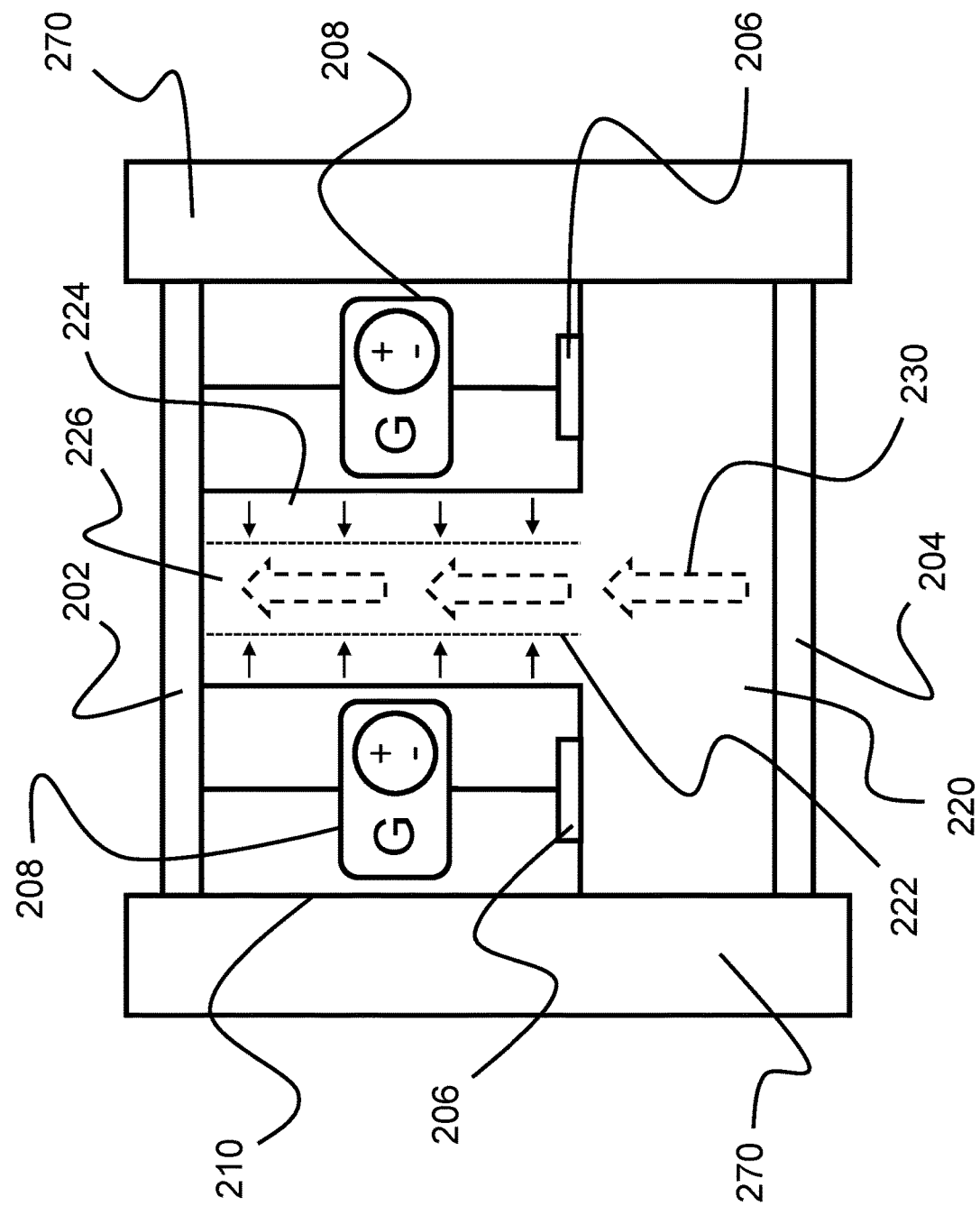
FIG. 2B is a cross-sectional view of the first example current limiting diode shown in FIG. 2A in a current limiting condition.

FIG. 2B shows a cross-sectional view of the first example current limiting diode 200 shown in FIG. 2A in a current limiting condition. In FIG. 2B, an electric current being conducted through the n-channel 220 between the source 202 and the drain 204 in the current limiting condition is represented by arrows 230. The electric current being conducted through the n-channel 220 in the current limiting condition may be a fault current which originates from an electrical power system in which the current limiting diode 200 is incorporated.

In a similar way to the conventional current limiting diode 100, the first example current limiting diode 200 has an electrical resistance which is primarily defined by a size of a depletion region 224 (and equally by a size of a current-carrying path 226) of the n-channel 220. The size of the depletion region 224 corresponds to a magnitude of an electric current being passed through the n-channel 200 from the drain 204 to the source 202. A relationship between the magnitude of the electric current being passed through the n-channel 220 from the drain 204 to the source 202 is very similar to the relationship described with respect to the conventional current limiting diode 100 with reference to FIGS. 1A and 1B. That is to say that the current limiting diode 200 operates in a manner which is analogous to a highly non-linear unidirectional resistor in that the electrical resistance of the current limiting diode 200 increases very rapidly as the magnitude of the electric current passing from the drain 204 to the source 202 increases above a saturation threshold.

The thermoelectric generator 208 is configured to generate a thermoelectric voltage by absorbing heat from the n-channel 220 and to reject heat to a heat sink 270 in the current limiting condition by virtue of a temperature differential between the n-channel 220 and the heat sink 270. The thermoelectric generator 208 is further configured to apply the thermoelectric voltage between the gate 206 and the source 202 of the current limiting diode 200. A magnitude of the thermoelectric voltage is dependent on a rate of heat absorption by the thermoelectric generator 208 from the n-channel 220. The rate of heat absorption by the thermoelectric generator 208 is correlated with the resistive heat generated within the current-carrying path 226 in both the normal operating condition and the current limiting condition. Accordingly, the magnitude of the thermoelectric voltage is related to a magnitude of an electric current being conducted through the current limiting diode 200 from the drain 204 to the source 202.

The application of the thermoelectric voltage between the gate 206 and the source 202 has the effect of partially turning the current limiting diode 200 off. When the current limiting diode 200 is partially switched off, the magnitude of an electric current being conducted from the drain 204 to the source 202 is reduced. In turn, the resistive heat generated within the current-carrying path 126 is reduced. As the magnitude of the thermoelectric voltage applied between the gate 206 and the source 202 increases, the current limiting diode 200 is switched off to a greater degree so that the magnitude of an electric current being conducted from the drain 204 to the source 202 is further reduced. In turn, the resistive heat generated within the current-carrying path 126 is further reduced and the magnitude of the thermoelectric voltage generated by the thermoelectric generator 208 is also reduced. The magnitude of the electric current being conducted from the drain 204 to the source 202 then increases, which brings an associated increase in the magnitude of the thermoelectric voltage generated by the thermoelectric generator 208 and so on and so forth.

As a result, the magnitude of the thermoelectric voltage and the magnitude of the electric current being conducted through the current limiting diode 200 from the drain 204 to the source 202 are so linked so as to form a negative feedback loop. The magnitude of the thermoelectric voltage and the magnitude of the electric current being conducted from the drain 204 to the source 202 are rapidly driven toward an equilibrium state by the negative feedback loop in which the thermoelectric generator 208 absorbs heat from the n-channel 220 which and applies a thermoelectric voltage across the gate 206 and the source 202.

In the equilibrium state, the magnitude of the electric current being conducted from the drain 204 to the source 202 is lower compared to a conventional current limiting diode 100 (as described with respect to FIG. 1 above) which is not provided with a thermoelectric generator as described above. Consequently, the resistive heat generated by the current limiting diode 200 in the current limiting condition is lower than the resistive heat generated by the conventional current limiting diode 100 in the current limiting condition. The reduction in the resistive heat dissipation rate of the n-channel 220 in the current limiting condition associated with the provision of the thermoelectric generator 208 reduces a risk of a maximum internal temperature of the current limiting diode 200 rising above a threshold temperature above which damage to and loss of function of the current limiting diode 200 may occur. In addition, this effect is achieved without a need for any additional components such as an external monitoring transducer, a gate drive circuit for a power supply or the like.

Otherwise, it may be that the reduction in the resistive heat dissipation rate of the n-channel 220 in the current limiting condition associated with the provision of the thermoelectric generator 208 is unable to prevent the maximum internal temperature rising above the threshold temperature, but nonetheless lengthens a critical time period of the current limiting diode 200. The critical time period is defined as a duration between a development of a current which places the current limiting diode 200 in the current limiting condition and a time at which the maximum internal temperature of the current limiting diode 200 exceeds the threshold temperature. A lengthened critical time period is associated with an improved durability of the current limiting diode 200 in the current limiting condition, because the current limiting diode 200 can operate in the current limiting condition for a longer period of time before damage to and loss of function of the current limiting diode 200 occurs.

In the example of FIGS. 2A and 2B, the thermoelectric generator 208 is shown as being disposed within the fill structure 210 and abutting the n-channel 220 for heat exchange therebetween. The thermoelectric generator 208 may be incorporated into the fill structure 210 by means of, for instance, evaporation deposition or lithography techniques. Nevertheless, it will be appreciated that in other examples the thermoelectric generator 208 may be disposed outside of the fill structure 210 and/or may not abut the n-channel 220. Examples in which the thermoelectric generator 208 is disposed outside of the fill structure 210 may be referred to as "die-stacked" examples. Similarly, in the example of FIGS. 2A and 2B, the heat sink is shown as abutting the fill structure 210 of the current limiting diode 200. Nevertheless, it will be appreciated that in other examples, the heat sink 270 may not abut the fill structure 210.

A thermal efficiency of the thermoelectric generator 208 is dependent on, among other things, a heat rejection temperature at which the thermoelectric generator 208 rejects heat to the heat sink 270, and a heat absorption temperature at which the thermoelectric generator 208 absorbs heat from the n-channel 220. A higher heat absorption temperature provides an increased thermal efficiency of the thermoelectric generator 208. Conversely, a lower heat rejection temperature provides an increased thermal efficiency of the thermoelectric generator 208.

If the thermoelectric generator 208 is disposed within the fill structure 210, as shown in FIGS. 2A and 2B, the heat absorption temperature at which the thermoelectric generator 208 absorbs heat, in use, from the n-channel 220 is increased. In particular, if the thermoelectric generator 208 abuts the n-channel 220, as shown in FIGS. 2A and 2B, the heat rejection temperature at which the thermoelectric generator 208 absorbs heat, in use, from the n-channel 220 is maximised. Likewise, if the thermoelectric generator 208 is disposed within the fill structure 210 and the heat sink 270 abuts the fill structure 210, as shown in FIGS. 2A and 2B, the heat rejection temperature at which the thermoelectric generator rejects heat, in use, to the heat sink 270 is minimised.

Figure 3:
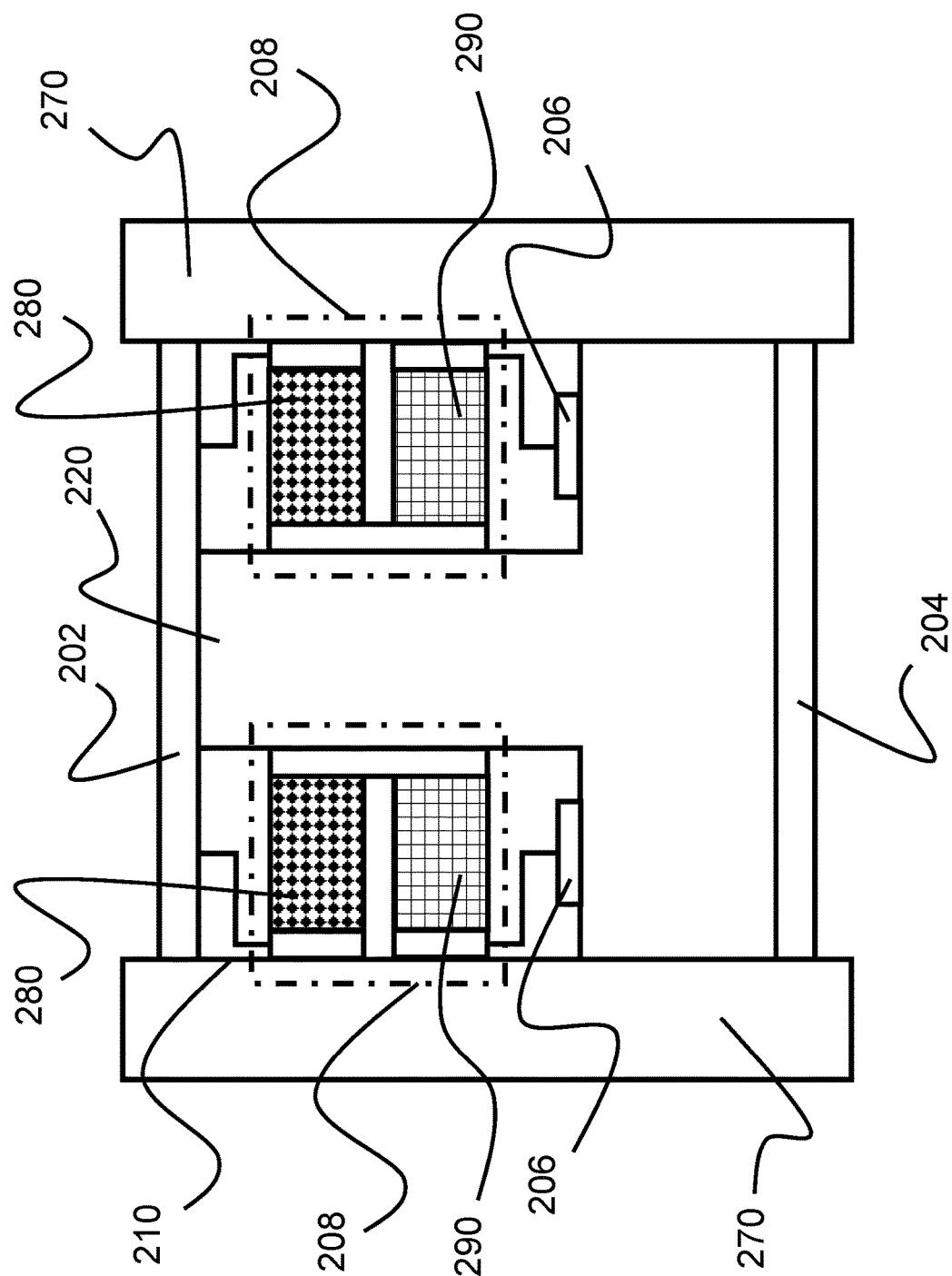
FIG. 3 is a cross-sectional view of a second example current limiting diode.

FIG. 3 shows a cross-sectional view of a second example current limiting diode 200. In the example of FIG. 3, the thermoelectric generator 208 comprises an n-type semiconductor 280 and a p-type semiconductor 290. Each semiconductor is disposed between the n-channel 220 and the heat sink 270. A direction of electron flow in response to a substantially identical temperature differential across the n-type semiconductor 280 and the p-type semiconductor 290 differs between the n-type semiconductor 280 and the p-type semiconductor 290. Therefore, the thermoelectric voltage applied between the gate 206 and the source 202 is increased by the inclusion of both the n-type semiconductor 280 and the p-type semiconductor 290 in the thermoelectric generator 208.

In addition, the thermal efficiency of the thermoelectric generator 208 is also dependent on a thermoelectric figure of merit. The thermoelectric figure of merit is a property associated with a material of the thermoelectric generator 208. A higher thermoelectric figure of merit corresponds to a higher thermal efficiency of the thermoelectric generator 208. Many known semiconductor materials have a high thermoelectric figure of merit, and therefore provide an increased thermal efficiency of the thermoelectric generator 208. The thermoelectric figure of merit, zT, is defined by the equation:

$$zT = \frac{\sigma S^2 T}{\kappa}$$

In this equation σ is the material's electrical conductivity, K is its thermal conductivity, S is its Seebeck coefficient and T is its temperature.

Figure 4:
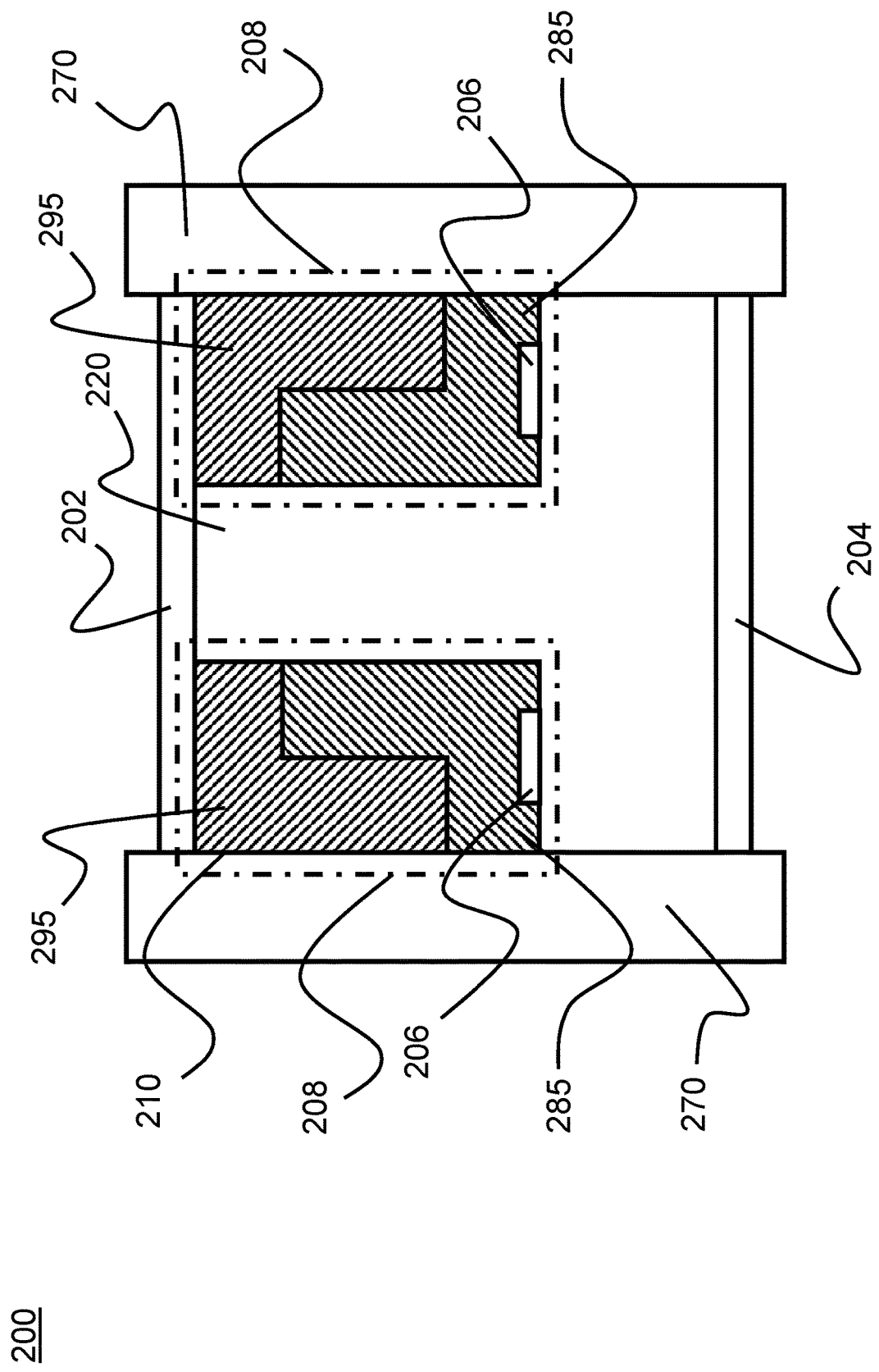
FIG. 4 is a cross-sectional view of a third example current limiting diode.

FIG. 4 shows a cross-sectional view of a third example current limiting diode 200. In the example of FIG. 4, the thermoelectric generator 208 is disposed within the fill structure 210 and comprises a first metal 285 and a second metal 295. The first metal 285 abuts the gate 206 and the second metal 295 abuts the source 202. The first metal 285 has a Seebeck coefficient which differs from a Seebeck coefficient of the second metal 295. The Seebeck coefficient relates to a thermoelectric response of each metal. Specifically, the Seebeck coefficient relates an electromotive force generated by each metal in response to a temperature differential applied thereto. Since the Seebeck coefficient differs for each metal, the electromotive force generated by the application of a temperature differential to each metal differs accordingly. The thermoelectric voltage produced by the thermoelectric generator 208 and applied between the gate 206 and the source 202 is the result of a difference between the electromotive force generated in each metal.

In the example of FIG. 4, the first metal 285 and the second metal 295 abut both the n-channel 220 and the heat sink 270. However, it will be appreciated that in other examples, the first metal 285 and/or the second metal 295 may not abut the n-channel 220 and/or the heat sink 270. In general, it is desirable to ensure that a larger temperature differential is applied to the first metal 285 and the second metal 295 so as to ensure that the difference between the electromotive force generated in each metal is maximised. In examples in which either the metal 285 and the second metal 295 abut both the n-channel 220 or the heat sink 270, a larger temperature differential is applied, in use, to the first metal 285 or the second metal 295. In examples in which both the first metal 285 and the second metal 295 abut both the n-channel 220 and the heat sink 270, the largest possible temperature differential is applied, in use, to the first metal 285 and the second metal 295.

For better operation of the current limiting diode 200, the disposition of the thermoelectric generator 208 within the fill structure 210 should not significantly weaken or disrupt the electrical connection between the source 202 and gate 206 provided by the fill structure 210. In examples in which the thermoelectric generator 208 is disposed within the fill structure 210, it may be advantageous to configure the thermoelectric generator 208 so as to preserve the electrical connection between the source 202 and the gate 206. The provision of the first metal 285 and the second metal 295 within the thermoelectric generator 208 better preserves the electrical connection between the source 202 and the gate 206 provided by the fill structure 210.

In all examples described above, the channel that connects the source and drain of each current limiting diode 200 is an n-channel. Those skilled in the art will appreciate that the channel could, in principle, instead be a p-channel, doped such that the majority carriers are 'holes' instead of electrons. The mobility of charge carriers in n-channel devices is typically significantly higher than those in p-channel devices, however, such that n-channel devices are generally preferred.

Figure 5:
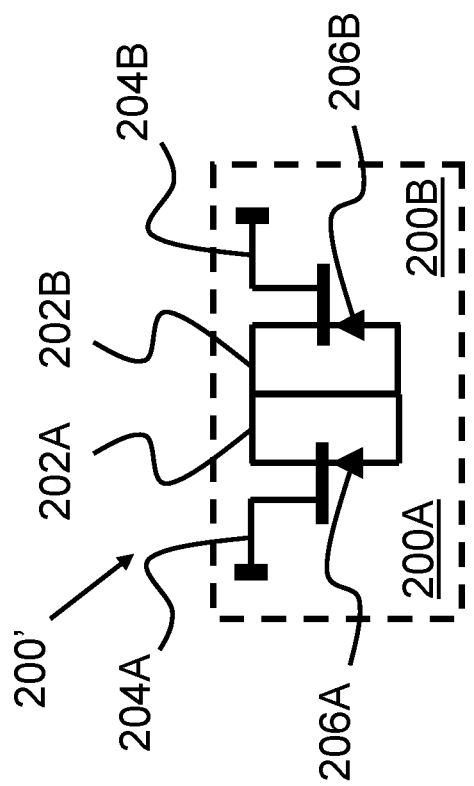
FIG. 5 is an electrical circuit symbol which represents a bidirectional current limiting device.

FIG. 5 is an electrical circuit symbol which represents a bidirectional current limiting device 200'. The bidirectional current limiting device 200' comprises a first current limiting diode 200A and a second current limiting diode 200B. Each current limiting diode is in accordance with any of the example current limiting diodes described above with reference to FIGS. 2-4.

In the example of FIG. 5, the first current limiting diode 200A is shown as being provided with a source 202A, a drain 204A and a gate 206A. Likewise, the second current limiting diode 200B is shown as being provided with a source 202B, a drain 204B and a gate 206B.

The source 202A of the first current limiting diode 200A and the source 202B of the second current limiting diode 200B are electrically connected in series. As such, the first current limiting diode 200A and the second current limiting diode 200B are electrically connected so as to form the bidirectional current limiting device 200'. Accordingly, the bidirectional current limiting device 200' is configured as a 2-terminal device which permits an electric current to be conducted between the drain 204A of the first current limiting diode 200A and the drain 204B of the second current limiting diode 200B through the n-channel of each current limiting diode.

A relationship between an electrical resistance of the bidirectional current limiting device 200' and a magnitude of an electric current passing from the drain 204A to the source 202A of the first current limiting diode 200A is highly non-linear. Similarly, a relationship between the electrical resistance of the bidirectional current limiting device 200' and a magnitude of an electric current passing from the drain 204B to the source 202A of the second current limiting diode 200B is highly non-linear.

In other words, the bidirectional current limiting device 200' operates in a manner which is analogous to a highly non-linear bidirectional resistor in that the electrical resistance of the bidirectional current limiting device 200' increases very rapidly as the magnitude of an electric current passing through the bidirectional current limiting device 200' in either direction increases above a saturation threshold. Accordingly, the bidirectional current limiting device 200' "saturates" at a near constant current level, irrespective of a direction of the electric current passing through the bidirectional current limiting device 200'.

Figure 6:
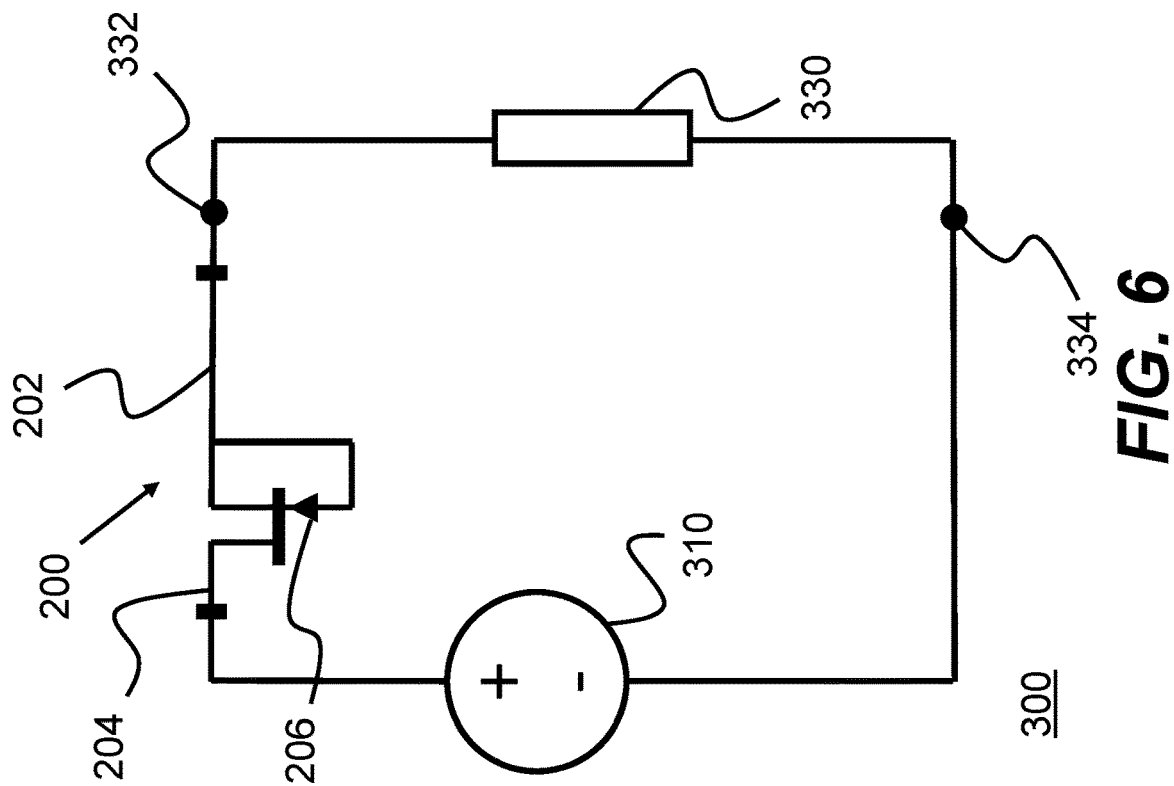
FIG. 6 is a diagram which shows a first example electrical power system comprising a current limiting diode.

FIG. 6 is a diagram of a first example electrical power system 300 comprising a current limiting diode 200 in accordance with any of the example current limiting diodes described above with reference to FIGS. 2-4. The electrical power system 300 further comprises an electrical power source 310 which is configured to supply an electrical power to the electrical power system 300 and an electrical network 330 connected between terminals 332 and 334. In the example of FIG. 6, the electrical network is represented by a load 330. The electrical network 330 may comprise, for example, at least one electrical load. The electrical network 330 may be a DC electrical network or an AC electrical network.

In a normal operating condition of the first electrical power system 300, a magnitude of an electric current being conducted through the current limiting diode 200 from the drain to the source is relatively low. Accordingly, the size of the depletion region within the current limiting diode 200 is relatively small and the electrical resistance of the current limiting diode 200 is also relatively small. Therefore, an amount of resistive heat dissipated by the current limiting diode 200 when the electrical power system 300 is in the normal operating condition is low. As a result, a power insertion loss associated with the inclusion of the current limiting diode 200 within the electrical power system 300 is minimised in the normal operating condition.

On the other hand, in a fault condition of the first electrical power system 300, a magnitude of an electric current being conducted through the current limiting diode 200 from the drain 204 to the source 202 may become large in a short period of time. Consequently, in the fault condition of the first electrical power system 300, the current limiting diode 200 may be placed in the current limiting condition.

For example, if an internal impedance of the electrical power source 310 is very low and an electrical energy delivery capacity of the electrical power source 310 is very high, a fault in the electrical power system 300 which originates in the electrical network 330 and which presents an effective short circuit across the electrical power source 310 may cause a magnitude of a fault current to be conducted through the electrical power system 300 which reaches an order of thousands of Amperes within a very short period of time. This may be because the magnitude of the fault current is only limited by the internal impedance of the electrical power source 310. If the magnitude of the fault current were not limited, the magnitude of the fault current could rise beyond a tolerance limit of the electrical power source 310 and/or a component of the electrical network 330.

In this example, the fault originates from the electrical network 330 and the fault current is therefore conducted through the current limiting diode 200 from the drain 204 to the source 202. If the fault current exceeds the saturation threshold of the current limiting diode 200, the current limiting diode 200 almost instantaneously limits the magnitude of the fault current by providing a greatly increased resistance through the n-channel 220. Accordingly, the current limiting diode 200 is configured to limit a fault current passing between the electrical power source 310 and the electrical network 330 in the fault condition. However, in another example, it may be that a fault originates from the electrical power source 310 and a fault current is therefore conducted through the current limiting diode 200 from the source 202 to the drain 204.

As mentioned above, the size of the depletion region of the n-channel 220 does not correspond to a magnitude of an electric current being passed from the source 202 to the drain 204. Therefore, in the configuration shown in FIG. 6, the current limiting diode 200 is not able to limit the magnitude of a fault current caused by a fault originating from the electrical power source 310. For this reason, an orientation of the current limiting diode 200 within the electrical power system 300 dictates whether the current limiting diode 200 is able to limit a fault current caused by a fault originating from the electrical network 330 or a fault current caused by a fault originating from the electrical power source 310. It will be appreciated that the current limiting diode 200 may be otherwise orientated within the electrical power system 300 such that the current limiting diode 200 is configured to limit a fault current caused by a fault originating from the electrical storage device 310.

In practice, the current limiting diode 200 is only able to respond to a development of the fault current caused by a fault originating from the electrical network 330 and to limit the fault current within a response time period of the current limiting diode 200. The response time period of the current limiting diode 200 may be, for example, of an order of a number of nanoseconds. Further, the current limiting diode 200 is configured to ensure that the magnitude of the fault current is maintained below the tolerance limit of the electrical power source 310 and/or a component of the electrical network 330.

In the example of FIG. 6, the electrical power source 310 is configured to provide a direct current to the electrical power system 300. However, it will be appreciated that the electrical power source 310 may equally be configured to provide another type of current to the electrical power system 300, such as an alternating current.

Figure 7:
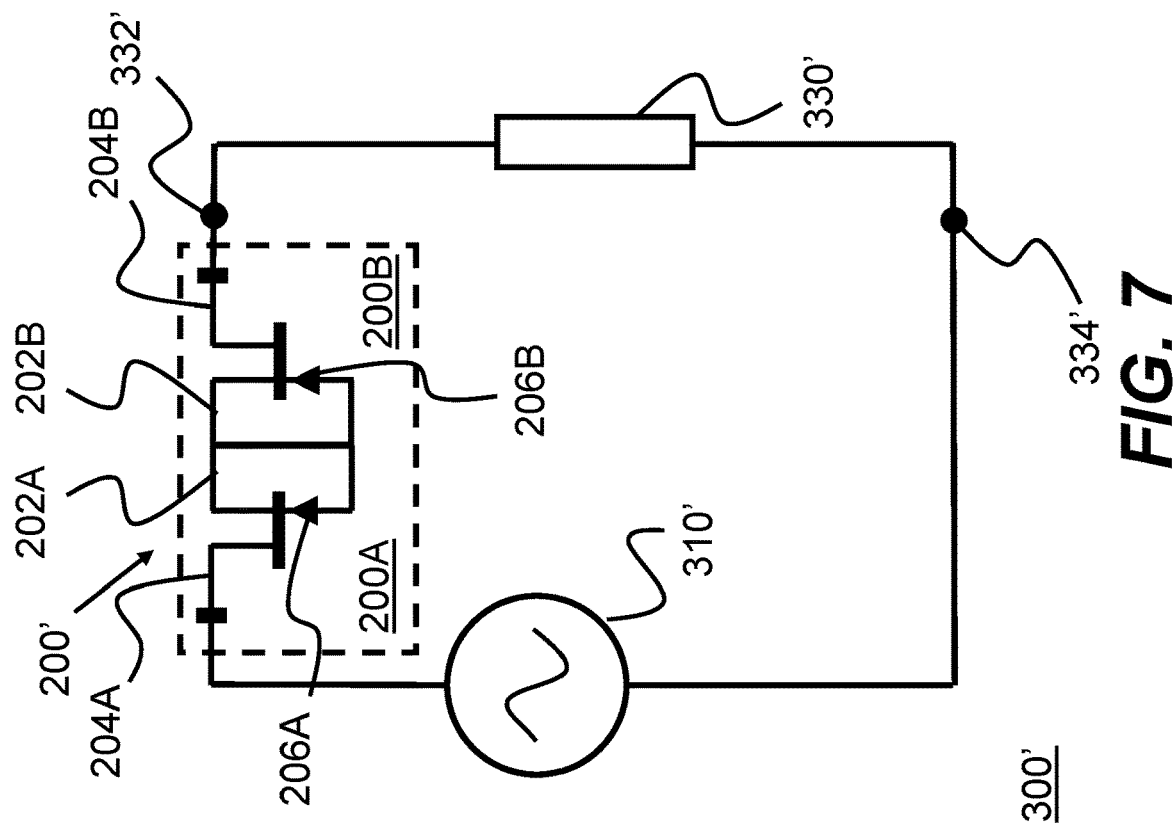
FIG. 7 is a diagram which shows a second example electrical power system comprising a bidirectional current limiting device.

FIG. 7 is a diagram of a second example electrical power system 300' comprising a bidirectional current limiting device 200' in accordance with the example bidirectional current limiting device 200' described above with reference to FIG. 5. The electrical power system 300' further comprises an electrical power source 310' which is configured to supply an electrical power to the electrical power system 300' and an electrical network 330' connected between terminals 332' and 334'. Many of the components of the second example electrical power system 300' are similar to or identical to the components of the first electrical power system 300, with like reference numerals indicating similar or identical components.

The bidirectional current limiting device 200' is configured to limit the magnitude of a fault current caused by a fault originating from the electrical network 330' and/or to limit the magnitude of a fault current caused by a fault originating from the electrical power source 310' in a fault condition of the second electrical power system 300'. In other words, the bidirectional current limiting device 200' is able to limit a fault current caused by a fault originating from the electrical network 330' or a fault current caused by a fault originating from the electrical power source 310' irrespective of an orientation of the bidirectional current limiting device 200' within the electrical power system 300'. Accordingly, the bidirectional current limiting device 200' is configured to limit a fault current passing between the electrical power source 310' and the electrical network 330' in the fault condition.

In the example of FIG. 7, the electrical power source 310' is configured to provide an alternating current to the electrical power system 300'. However, it will be appreciated that the electrical power source 310' may equally be configured to provide another type of current to the electrical power system 300', such as a direct current.

Figure 8:
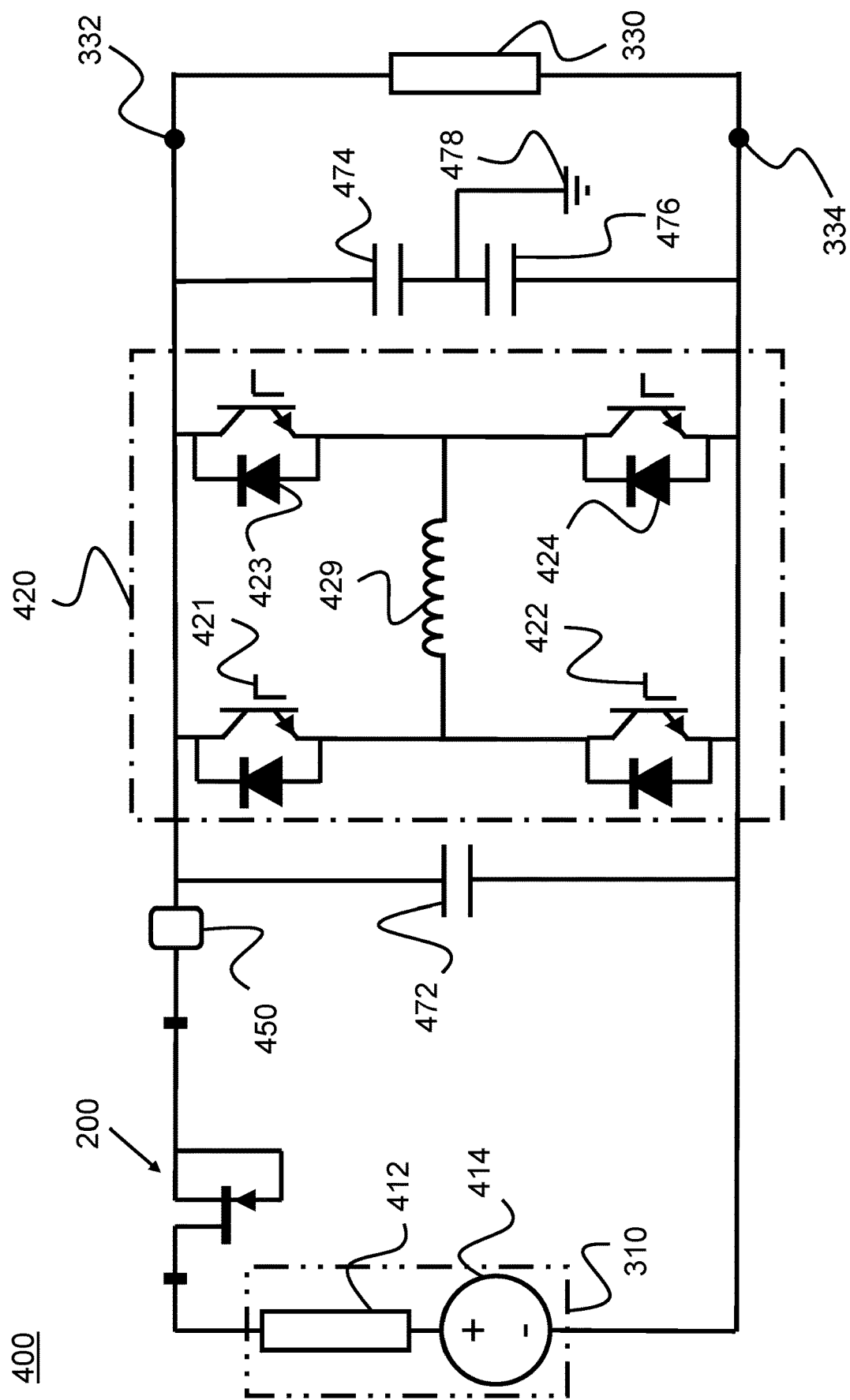
FIG. 8 is a diagram which shows a third example electrical power system comprising a current limiting diode.

FIG. 8 is a diagram of a third example electrical power system 400. Many of the components of the third electrical power system 400 are similar to or identical to the components of the first electrical power system 300, with like reference numerals indicating similar or identical components. The above description of the features and advantages of the first electrical power system 300 applies, mutatis mutandis, to the features and advantages of the third electrical power system 400.

The electrical power system 400 comprises a controllable circuit interruption device 450. The controllable circuit interruption device 450 is configured to interrupt the fault current shortly after the development of the fault current in response to a determination that the electrical power system 400 is in a fault condition. The controllable circuit interruption device 450 may monitor an electrical current passing between the electrical power source 310 and the electrical network 330 in order to determine whether the electrical power system 400 is in the fault condition. However, the controllable circuit interruption device 450 is only able to respond to the development of the fault current and interrupt the fault current within a response time period of the controllable circuit interruption device 450.

The response time period of the controllable circuit interruption device 450 is longer than the response time period of the current limiting diode 200. Accordingly, the current limiting diode 200 and the controllable circuit interruption device 450 are configured to co-operate in use so as to limit and then to interrupt a fault current passing between the electrical power source and the electrical network 330 in the fault condition. The current limiting diode 200 and the controllable circuit interruption device 450 provide the electrical power system 400 with a resettable protection system against faults originating from the electrical network 330 in the fault condition.

A safety-time margin of the electrical power system 400 is defined as a difference between the response time period of the controllable circuit interruption device 450 and the critical time period of the current limiting diode 200. A longer safety-time margin is associated with an improved safety of the electrical power system 400. As described above, the reduction in the resistive heat dissipation rate of the current limiting diode 200 in the current limiting condition associated with the provision of the thermoelectric generator 208 lengthens the critical time period of the current limiting diode 200 and thereby lengthens the safety-time margin of the electrical power system 400.

Additionally, the provision of the thermoelectric generator 208 within the current limiting diode 200 permits a controllable circuit interruption device having a response period which would not be suitable for use in conjunction with a conventional current limiting diode to be used in conjunction with the current limiting diode 200. In particular, the controllable circuit interruption device 450 may comprise a controllable contactor (e.g. a DC contactor) which provides a physical circuit break (that is, Galvanic isolation) in an electrical power system but which may have a longer response time period than a critical time period of a conventional current limiting diode. The physical circuit break is associated with an improved safety of the electrical power system 400. In other examples the controllable circuit interruption device 450 may comprise a solid-state circuit breaker or the like.

In the example of FIG. 8, an internal impedance of the electrical power source 310 is represented by a resistor 412 and the electrical energy delivery capacity of the electrical power source 310 is represented by a voltage source 414. The electrical power source 310 may comprise, for example, a battery, a capacitor and/or an ultracapacitor. The electrical power source 310 may comprise a high-density battery.

The electrical power system 400 may further comprise a power electronics converter 420. In the example shown in FIG. 8, the power electronics converter 420 comprises a DC to DC converter and the electrical network 330 is a DC electrical network. The DC to DC converter may comprise a plurality of transistors 421-424 and an inductor coil 429. The power electronics converter 420 provides a regulation function to the electrical power system 400, as described in further detail below. It will be appreciated that the power electronics converter 420 may otherwise comprise a DC to AC to DC converter or the like. In other examples, the power electronics converter 420 comprises an AC to DC converter. In further examples, the power electronics converter 420 comprises a DC to AC converter and the electrical network 330 is an AC electrical network.

In the arrangement of FIG. 8, the electrical power source 310 is configured to provide a first electrical potential difference to the power electronics converter 420. The power electronics converter 420 is configured to convert and/or regulate the electrical potential difference provided by the electrical power source 310 and provide a second electrical potential difference to the electrical network 330. Accordingly, the power electronics converter 420 provides a regulation function to the electrical power system 400. In particular, the power electronics converter 420 allows the first electrical potential difference provided by the electrical power source 310 to change while maintaining a substantially constant second electrical potential difference provided to the electrical network 330. The electrical network 330 may comprise at least one load component which benefits from being driven by a substantially constant electrical potential difference.

Also in the example shown in FIG. 8, the third example electrical power system 400 comprises a plurality of additional components. In FIG. 4, the plurality of additional components includes a first DC capacitor 472, a second DC capacitor 474, a third DC capacitor 476 and an earth ground 478. It will be appreciated that these components are shown and described for the purpose of illustration and are not to be construed as essential elements of the third electrical power system 400.

Figure 9:
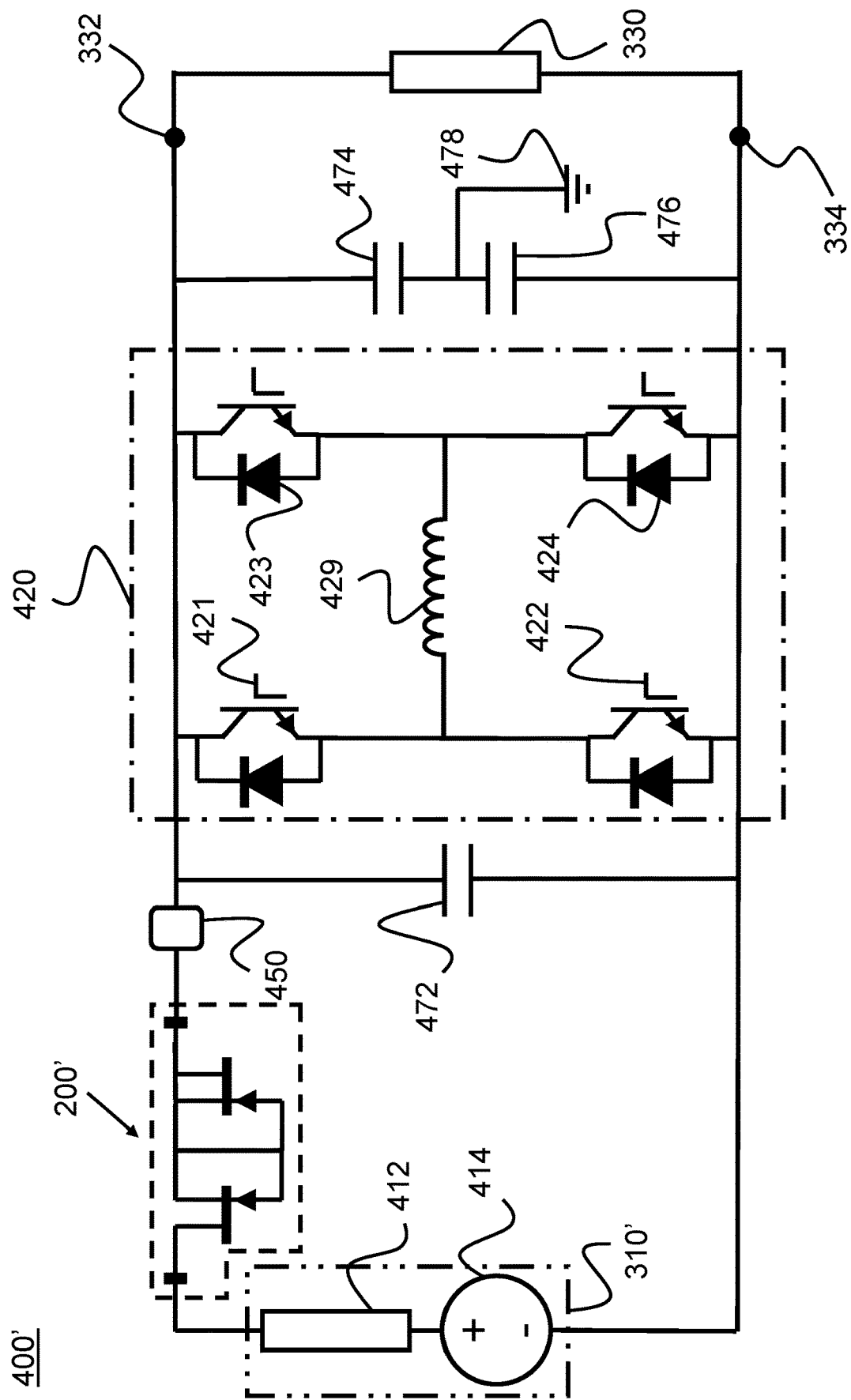
FIG. 9 is a diagram which shows a fourth example electrical power system comprising a bidirectional current limiting device.

FIG. 9 is a diagram of a fourth example electrical power system 400'. Many of the components of the fourth electrical power system 400' are similar to or identical to the components of the second electrical power system 300' and the third electrical power system 400, with like reference numerals indicating similar or identical components. The above description given with respect to the features and advantages of the second electrical power system 300' and the third electrical power system 400 applies, mutatis mutandis, to the features and advantages of the fourth electrical power system 400'.

Nevertheless, for the avoidance of doubt, the bidirectional current limiting device 200' and the controllable circuit interruption device 450 are configured to co-operate in use so as to limit and then to interrupt a fault current passing between the electrical power source 310 and the electrical network 330 in a fault condition of the fourth electrical power system 400'. In particular, the bidirectional current limiting device 200' is able to limit a fault current caused by a fault originating from the electrical network 330 or a fault current caused by a fault originating from the electrical power source 310' irrespective of an orientation of the bidirectional current limiting device 200' within the electrical power system 400'. Consequently, the bidirectional current limiting diode 200' and the controllable circuit interruption device 450 provide the electrical power system 400' with a more versatile resettable protection system against a fault current passing between the electrical power source 310 and the electrical network 330 in the fault condition.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A current limiting diode comprising a gate, a source, a drain electrically connected to the source by an n-channel or p-channel and a thermoelectric generator; wherein the source and the gate are electrically connected by a fill structure, wherein the thermoelectric generator is disposed within the fill structure and abuts the n-channel or p-channel for heat exchange therebetween, and wherein the thermoelectric generator is configured to:
    generate a thermoelectric voltage by absorbing heat from the n-channel or p-channel and rejecting heat to a heat sink in a current limiting condition; and
    apply the thermoelectric voltage between the gate and the source in order to reduce a flow of current through the current limiting diode.

2. The current limiting diode of claim 1, wherein the thermoelectric generator comprises a p-type semiconductor and an n-type semiconductor.

3. The current limiting diode of claim 1, wherein the thermoelectric generator comprises:
    a first metal which abuts the gate; and
    a second metal which abuts the source;
    and wherein the first metal has a Seebeck coefficient which differs from a Seebeck coefficient of the second metal.

4. The current limiting diode of claim 3, wherein the first metal abuts the n-channel or p-channel and the heat sink.

5. The current limiting diode of claim 3, wherein the second metal abuts the n-channel or p-channel and the heat sink.

6. The current limiting diode of claim 1, wherein the drain is electrically connected to the source by an n-channel.

7. A bidirectional current limiting device comprising a first current limiting diode and a second current limiting diode, wherein:
    each current limiting diode is in accordance with claim 1; and
    the source of the first current limiting diode is electrically connected to the source of the second current limiting diode.

8. An electrical power system comprising: the current limiting diode of claim 1; an electrical power source; and an electrical network, and wherein the current limiting diode or the bidirectional current limiting device is configured to limit a fault current passing between the electrical power source and the electrical network in a fault condition.

9. The electrical power system of claim 8, further comprising a controllable circuit interruption device configured to interrupt the fault current in response to a determination that the electrical power system is in the fault condition.

10. The electrical power system of claim 9, wherein the electrical power source comprises a battery.

11. The electrical power system of claim 8, further comprising a power electronics converter.

12. An aircraft power and propulsion system comprising the electrical power system of claim 8.

13. An aircraft comprising the electrical power system of claim 8.

* * * * *